(12) United States Patent
Kerner

(10) Patent No.: US 9,319,791 B2
(45) Date of Patent: Apr. 19, 2016

(54) REDUCED-DELAY SUBBAND SIGNAL PROCESSING SYSTEM AND METHOD

(71) Applicant: Yair Kerner, Kiryat Ono (IL)

(72) Inventor: Yair Kerner, Kiryat Ono (IL)

(73) Assignee: CONEXANT SYSTEMS, INC., Newport Beach, CA (US)

( * ) Notice: Subject to any disclaimer, the term of this patent is extended or adjusted under 35 U.S.C. 154(b) by 267 days.

(21) Appl. No.: 13/840,302

(22) Filed: Mar. 15, 2013

(65) Prior Publication Data

US 2013/0287226 A1    Oct. 31, 2013

Related U.S. Application Data

(60) Provisional application No. 61/640,601, filed on Apr. 30, 2012.

(51) Int. Cl.
| | |
|---|---|
| *H03G 5/00* | (2006.01) |
| *H04B 3/20* | (2006.01) |
| *H04B 15/00* | (2006.01) |
| *H04R 3/04* | (2006.01) |
| *G10L 21/0232* | (2013.01) |
| *H04M 9/08* | (2006.01) |
| *G10L 21/0208* | (2013.01) |

(52) U.S. Cl.
CPC ............. *H04R 3/04* (2013.01); *G10L 21/0232* (2013.01); *G10L 2021/02082* (2013.01); *H04B 3/20* (2013.01); *H04M 9/082* (2013.01); *H04R 2430/03* (2013.01)

(58) Field of Classification Search
None
See application file for complete search history.

(56) References Cited

U.S. PATENT DOCUMENTS

| | | | |
|---|---|---|---|
| 6,377,637 B1* | 4/2002 | Berdugo | 375/346 |
| 6,856,653 B1* | 2/2005 | Taniguchi et al. | 375/285 |
| 8,155,304 B2* | 4/2012 | Li et al. | 379/406.12 |
| 2013/0035777 A1* | 2/2013 | Niemisto et al. | 700/94 |

OTHER PUBLICATIONS

Sommen, P.C.W., Partitioned Frequency Domain Adaptive Filters; Eindhoven University of Technology; pp. 677-681, 1989.

* cited by examiner

*Primary Examiner* — Andrew L Sniezek
(74) *Attorney, Agent, or Firm* — Haynes and Boone, LLP

(57) ABSTRACT

A method for signal processing, receiving a time domain signal having a sample-rate Fs and generating N time domain signal bands, each having a bandwidth equal to Fs/N. Receiving the N signal bands and transforming a first time domain signal band to a frequency domain at a first resolution and a second time domain signal band to the frequency domain at a second resolution, where the first resolution may be different from the second resolution. Determining one or more first filter coefficients using the frequency domain components from the first signal band and one or more second filter coefficients using the frequency domain components from the second signal band. Transforming the first and second filter coefficients from the frequency domain to a time domain. Applying the first and second time domain filter coefficients to the first and second time domain signals, respectively.

18 Claims, 3 Drawing Sheets

REDUCED-DELAY SUBBAND SIGNAL PROCESSING SYSTEM AND METHOD

RELATED APPLICATIONS

The present application claims benefit of U.S. provisional patent application 61/640,601, filed Apr. 30, 2012, entitled "REDUCED-DELAY SUBBAND SIGNAL PROCESSING SYSTEM AND METHOD," which is hereby incorporated by reference for all purposes as if set forth herein.

TECHNICAL FIELD

The present disclosure relates generally to signal processing, and more specifically to a system and method for reduced-delay subband signal processing

BACKGROUND OF THE INVENTION

Sub-band signal processing is commonly used for various algorithms, such as acoustic echo cancellation, noise reduction or beam forming. While it has known advantages over full-band processing, there is a problem of increased delay. For example, a sub-band system with 128 bands for processing a 16 KHz signal introduces additional delay of 25-40 msec. For some applications, like phones, customers require a shorter delay without sacrificing the algorithm performance.

SUMMARY OF THE INVENTION

A method for signal processing is disclosed. The method includes receiving a time domain signal having a sample-rate Fs and generating N time domain signal bands, each having a bandwidth equal to Fs/N, and referred to collectively as sub-band decomposition at a coarse resolution. Receiving the N signal bands and transforming a first time domain signal band to a frequency domain at a first fine resolution and a second time domain signal band to the frequency domain at a second fine resolution, where the first resolution may be different from the second resolution or identical to it. Executing signal processing algorithms on none, part or all of the coarse resolution signal bands. Determining one or more first filter coefficients using the fine resolution frequency domain components from the first signal band and one or more second filter coefficients using the fine resolution frequency domain components from the second signal band. Transforming the first and second filter coefficients from the frequency domain to a time domain. Applying the first and second time domain filter coefficients to the first and second time domain signals, respectively.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE SEVERAL VIEWS OF THE DRAWINGS

Aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views, and in which.

DETAILED DESCRIPTION OF THE INVENTION

Figure 1:
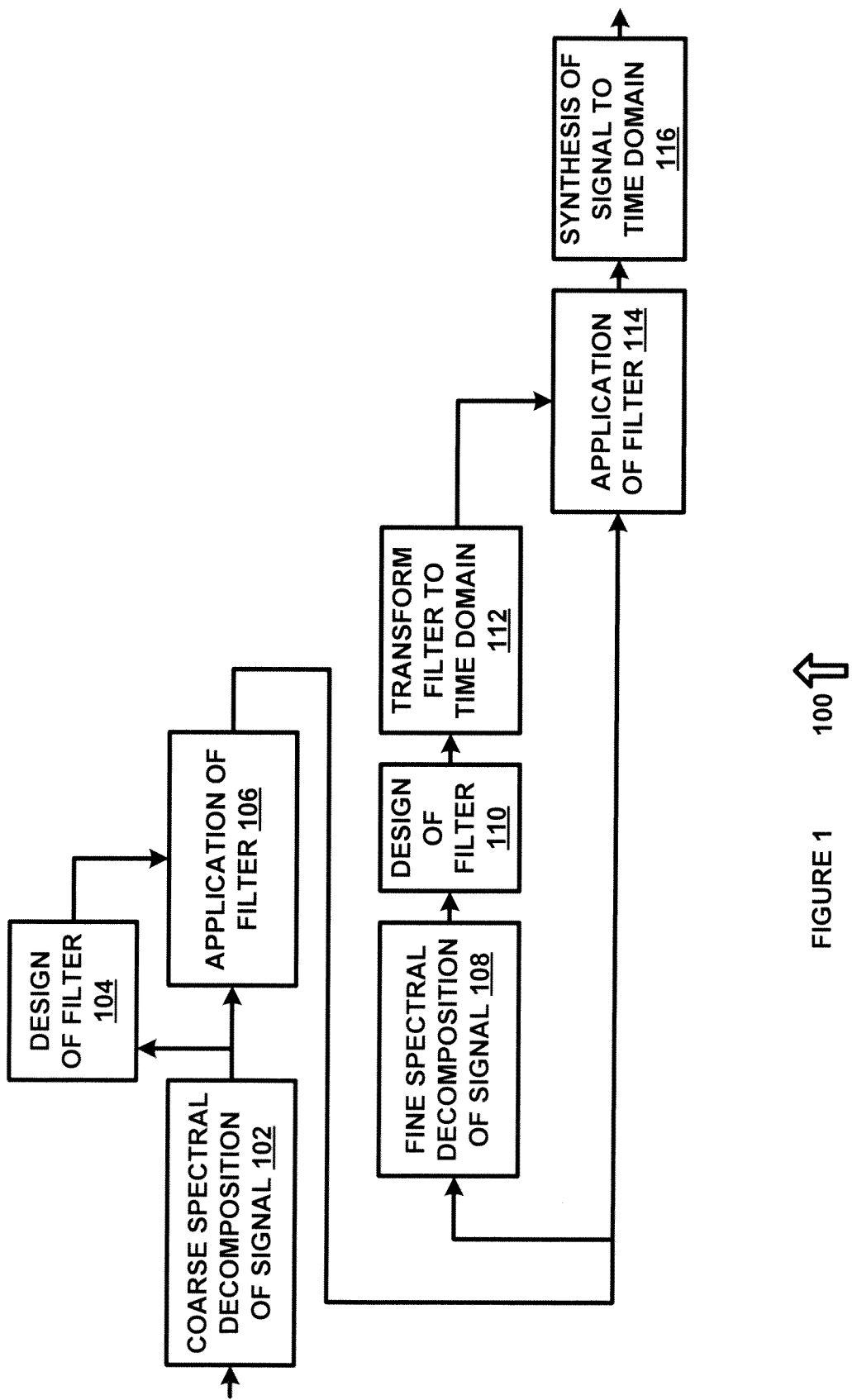
FIG. 1 is a diagram of a system for sub-band processing without incurring the additional delays by use of regular sub-band decomposition with fewer bands.

In the description that follows, like parts are marked throughout the specification and drawings with the same reference numerals. The drawing figures might not be to scale and certain components can be shown in generalized or schematic form and identified by commercial designations in the interest of clarity and conciseness.

A two-stage sub-band signal processing algorithm is disclosed that can be used for voice processing or other suitable applications. In this regard, sub-band signal processing can be used for various algorithms, such as acoustic echo cancellation (AEC), noise reduction (NR) or beam forming (BF). While sub-band signal processing has known advantages over full-band processing, known uses of sub-band signal processing have problems due to increased delay. For example, a sub-band system with 128 bands for processing a 16 KHz signal will introduce an additional delay of 25-40 msec. For some applications, such as telecommunication, customers require a shorter delay without sacrificing the algorithm performance.

One solution is to perform all processing in full-band (i.e. time-domain processing) so the delay is minimal but the advantages of sub-band processing are given up. Another solution is to perform spectral analysis, which incurs a small additional delay (2-5 msec), to design filters in the frequency domain, to transform the filters to the time-domain and finally to apply them to the signal in the time-domain. This approach allows some of the advantages of sub-band processing, but not all.

FIG. 1 is a diagram of a system 100 for sub-band processing in accordance with an exemplary embodiment of the present disclosure. System 100 avoids the additional delays that may otherwise be incurred when using sub-band processing by use of regular sub-band decomposition with fewer bands.

System 100 can be implemented in hardware or a suitable combination of hardware and software, and can be one or more integrated circuit components. As used herein, "hardware" can include a combination of discrete components, an integrated circuit, an application-specific integrated circuit, a field programmable gate array, or other suitable hardware. As used herein, "software" can include one or more objects, agents, threads, lines of code, subroutines, separate software applications, one or more lines of code or other suitable software structures operating in one or more software applications or on one or more processors, or other suitable software structures. In one exemplary embodiment, software can include one or more lines of code or other suitable software structures operating in a general purpose software application, such as an operating system, and one or more lines of code or other suitable software structures operating in a specific purpose software application.

In one exemplary embodiment, coarse spectral decomposition of signal 102 processes 16 KHz signals with 32 bands that results in an additional delay of 6-10 msec and in a 500 Hz width for each band (which are ¼ of the delay when compared to processing with 128 bands and at one quarter of the band's width). The signals in at least part of the bands are further processed by fine spectral decomposition of signal 108 by treating the signal of each specific band as a time-domain signal and performing on it finer-resolution spectral analysis, designing filters in the finer-resolution frequency domain, transforming them to the "time-domain" of the coarse sub-band and applying them there.

The present disclosure thus introduces a much smaller delay than ordinary sub-band signal processing while not sacrificing the advantages of sub-band processing. The present disclosure also provides the benefit of allowing part of the algorithm to process the signal at coarse frequency-resolution (suitable for AEC) while other algorithms process the signal at fine resolution (suitable for NR and BF).

Coarse spectral decomposition of signal 102 can be implemented using a uniform discrete Fourier transform (DFT) filter bank that performs coarse sub-band decomposition into N bands, for example N=32 for a sample-rate of fs=16,000 Hz, or other suitable processes can also or alternatively be used. The spacing between neighboring bands or the bandwidth of each band is defined by:

$$B\text{coarse} = fs/N, \quad (1)$$

which is 500 Hz in this exemplary embodiment. This stage can include decimation of the signal in each band by a factor of half the number of bands N/2, such that the sample rate at the coarse domain can be defined by:

$$f\text{coarse} = 2fs/N = 2B\text{coarse}. \quad (2)$$

In this exemplary embodiment, the decimation factor is N/2=16 and the coarse sample rate is fcoarse=1000 Hz.

Fine spectral decomposition of signal 108 can be performed using a windowed DFT with length K and 50% overlap, i.e. windowing and FFT calculation is done once in K/2 samples at the coarse sample rate, which are equivalent to KN/4 samples at the original sample rate. Likewise, other suitable processing can also or alternatively be used. In this exemplary embodiment, if K=16 then the calculation is performed every 8 coarse samples, or every 128 time-domain samples, or 8 msec. The inter-bin spacing can be defined by:

$$B\text{fine} = f\text{coarse}/K = 2fs/(N \cdot K), \quad (3)$$

which is comparable to single-stage decomposition with (N·K)/2 bins. Thus, in the example here the fine resolution is Bfine=62.5 Hz, like a single stage with 256 bins.

Assuming that the time-domain signal is real, the second analysis can be applied to M coarse bands, where $$M \leq (N/2 + 1). \quad (4)$$

The maximal M is in the case that all bands from 0 Hz to fs/2 are analyzed for fine resolution. The coarse bands are enumerated with index m, where m=0 corresponds with the band that is centered around 0 Hz and m=N/2 corresponds with the band that is centered around fs/2. The fine bands are enumerated with index k, where $0 \leq k \leq K-1$.

The decimation by factor N/2 in the coarse spectral decomposition stage maps the original frequency range of a coarse band m, i.e. from (m−1)·B to (m+1)·B, to the range from 0 to fcoarse in one of two ways, depending on whether m is odd or even. If m is odd, there is a simple frequency translation by (m−1)·B, i.e. f=(m+a)·B is mapped to (1+a)·B with $-1 \leq a \leq 1$. As such, the center frequency m·B at the original sample rate is mapped after the first stage to B and therefore after the second stage to the fine bin k=K/2. For example, in the case of coarse band 3, the original frequencies 1000, 1250, 1499, 1500, 1750 and 1999 Hz are mapped correspondingly to 0, 250, 499, 500, 750 and 999 Hz. If m is even, swapped mapping occurs, with the lower half of the band translated by (m−2)·B and the upper half by m·B. As such, the center frequency m·B at the original sample rate is mapped after the first stage to 0 Hz and after the second stage to fine bin k=0. For example, in the case of coarse band 4, the original frequencies 1500, 1750, 1999, 2000, 2250 and 2499 Hz are mapped correspondingly to 500, 750, 999, 0, 250, 499 Hz.

In order to simplify the subsequent inspection of the fine bins, the low and high halves of the fine bins are swapped after the FFT calculation. After this step, the relation between the original frequencies and the fine bins is simple frequency translation by (m−1)·B, i.e. the mapping for the even bands becomes similar to that of the odd bins.

As explained in greater detail below, only the center half of the fine bins are used for filter design in design of filter 110. Therefore, it is sufficient to copy the lowest and highest quarters of the fine bins. The lowest quarter [0, K/4) is copied to above the center [K/2, K·3/4), and the highest quarter [K·3/4, K) are copied to below the center [K/4, K/2).

In addition to the advantage of moving less elements, the copying of two quarters avoids the overlap in the ranges of the source and destination of the copy operation that exists when swapping the halves.

As discussed above, the coarse sample rate is twice the coarse bandwidth. Consequently, the filter bank of the first stage application of filter 106 significantly attenuates the two quarters that are furthest from the center frequency. As a result, the fine resolution filter design 110 for each coarse band of coarse spectral decomposition 102 should rely on only the center half of the spectrum, that is to say the fine bins in the range [K/4, K·3/4). For example, in the case of coarse bin 4 that spans the range 1500-2500 Hz, the present disclosure can rely only on the range 1750-2250 Hz, where suitable.

After the fine resolution filter has been designed for this center half of all the coarse bands, the results are exchanged between each pair of neighboring bands so as to complete the two missing quarters. For each coarse band m, the second quarter [K/4, K/2) completes the fourth quarter [K·3/4, K) of the lower band m−1, and the third quarter [K/2, K·3/4) completes the first quarter[0, K/4) of the higher band m+1. For example, fine bins four through seven of coarse band four complete fine bins 12-15 of coarse band three, as both of these ranges correspond with the original frequency range 1750-2000 Hz. Similarly, fine bins 8-11 of coarse band four complete fine bins zero through three of coarse band five, as both of these ranges correspond with the original frequency range 2000-2250 Hz.

Exceptions for the above rule are the first and last coarse bands. The first coarse band completes the next one and the last coarse band only completes the previous one. Also, if the first band is m=0 or the last band is m=N/2, care should be taken that the design is symmetric between the lower and higher halves.

Finally, before transforming the filter of each coarse band from the fine domain to the coarse domain through inverse fast Fourier transform (IFFT) at transform filter to time domain 112, some smoothing of the filter coefficients in the fine domain can help to reduce artifacts and musical noise. This includes cyclic smoothing of the edge bins due to the cyclic nature of the DFT, e.g. replacing the coefficient at fine bin k=0 with the average of its value and the value of fine bin k=K−1.

The calculation of the filter coefficients in the coarse domain can be performed using the following exemplary steps for each coarse band, or other suitable processes. Conversion from the fine domain to the coarse domain can be accomplished by performing an inverse fast Fourier transform (IFFT) of length K once in K/2 coarse-domain samples, or other suitable processes, which provides K complex-valued coefficients. This operation can be synchronized with the windowed FFT that decomposes the signal to the fine domain.

The two halves of the coarse domain coefficients can also be swapped, as the coefficients are determined in the fine domain relative to phase 0, which after IFFT brings the coefficients to be cyclically clustered around index 0 rather than being around the middle of the filter.

The order of coefficients from first to last can also be flipped, if needed, for an efficient implementation of convolution. This operation can be combined with the swapping of the two halves into a single operation, which is equivalent to flipping the order of coefficients within the first half and within the second half separately without swapping the halves.

Linear interpolation between the newest coefficients and the previous coefficients can also or alternatively be used. This operation, unlike the ones listed above, can be performed once for every K/4 or less samples, once for every coarse-domain sample, or in other suitable manners. The purpose of this gradual transition is to avoid abrupt changes in filter coefficients, which can cause audio noise or audio artifacts.

The calculated complex-valued coefficients can be multiplied by delayed coarse-domain samples that have been stored in a FIFO or other suitable locations. This multiplication can use the coefficient values as they are and, namely not their conjugate values.

If the fine-domain filter-design is performed only for part of the coarse bands or if the parameter K is not the same for all coarse bands, the difference in delay can be compensated among the coarse bands, since the procedure above yields a delay of K/2 coarse-domain samples at each band where it is applied.

In operation, the time domain signal of system 100 is decomposed, such as into 32 bands (or other suitable numbers of bands), which can be modeled as a time-domain filtering of a single signal by 32 band-pass filters following by down-sampling of each band by a factor of 16 (instead of 128 filters and down-sampling by 64 or other suitable comparative processes). In this exemplary embodiment, the 32 values of filters can be viewed at a specific time as the frequency spectrum of the time-domain signal, the output of a specific filter can be viewed as a time-sequence at a coarse resolution.

Processing can be performed on these time domain signals, such as AEC processing that can be performed using FIR filtering with LMS adaptation to the decomposed signals viewing each as a time sequence, or NR processing to estimate noise and apply corresponding attenuation (at least to the high-frequency bands), viewing the bands as the frequency spectrum.

Additional processing is performed by a second-stage decomposition of each band separately as a time sequence. This second-stage decomposition can be performed on only part of the bands (typically the lower frequency ones), and with different resolution (i.e. different length of the Fourier transform). Estimation is performed in the fine frequency-resolution, e.g. noise level and signal to noise ratio, and some filter design is performed, such as the determine an attenuation value for each fine-frequency component. Finally, the filter coefficients are transformed to the coarse domain (such as by using an inverse Fourier transform or in other suitable manners), and can be applied there as a FIR filter or in other suitable manners.

Conversion of the 32 bands (in this exemplary embodiment) from the time domain to the frequency domain can be performed in parallel for a more efficient implementation. A uniform DFT filter bank can be used as a single filter and a FFT of size 32 can be used to calculate the output of 32 filters.

The parameters of the fine resolution spectral analysis can include a windowed-FFT of length 16, with multiplying of the FFT input by a Hann window, and with overlap of 50%, i.e. every 8 coarse-domain samples (in this exemplary embodiment).

The filtered results from the coarse domain can be mapped to the time domain through sub-band synthesis, using a uniform DFT filter bank or in other suitable manners. This operation is similar to up-sampling by a factor of 16 (such as by inserting 15 zeroes between adjacent samples of each sub-band), applying 32 band-pass filters (one to each band) and then summing up all bands. The actual efficient implementation has the same cost in terms of processing time and other requirements as in the decomposition.

In one exemplary embodiment, all filtering can be performed in the coarse frequency domain. The portion of sub-bands which go through the fine frequency domain is determined at the stage of algorithm design, according to required resolution (usually higher resolution is needed at lower frequencies) and different constraints (such as memory or CPU cycles that are available). While ordinary sub-band solutions have to choose between high frequency-resolution or low delay, the current disclosure allows both to be achieved.

Figure 2:
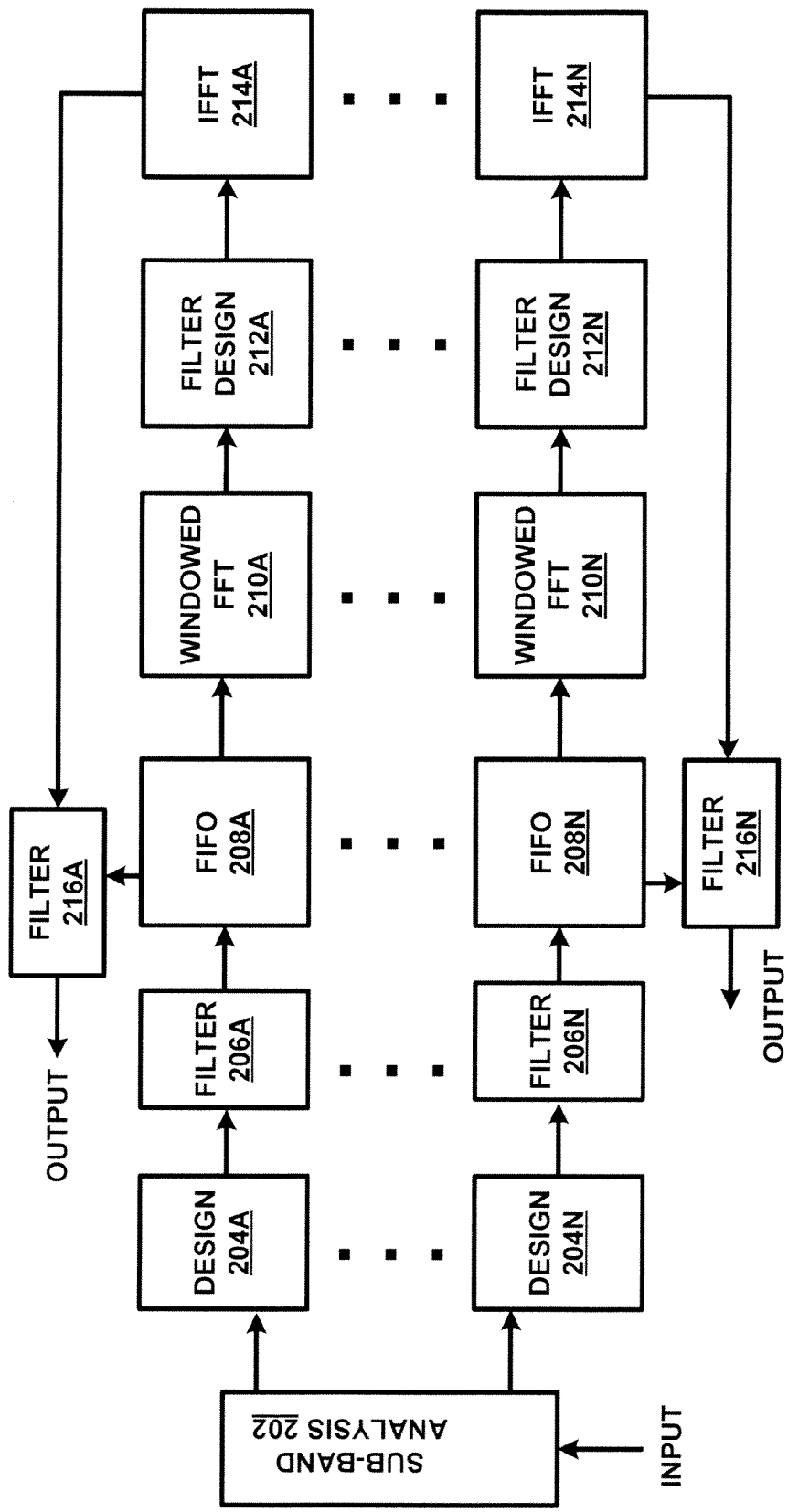
FIG. 2 is a diagram of a system for sub-band processing in accordance with an exemplary embodiment of the present disclosure.

FIG. 2 is a diagram of a system 200 for sub-band processing in accordance with an exemplary embodiment of the present disclosure. An input signal is received at sub-band analysis 202, which can include uniform DFT filter bank processing as described herein or other suitable processes. The sub-band signals are provided to filter design 204A through 204N, which can generate echo cancellation filters, echo suppression filters or other suitable filters. The associated filters 206A through 206N are applied to the signal. The output from filters 206A through 206N is buffered at FIFO 208A through 208N, and fine spectral decomposition of the signal is performed by windowed FFT 210A through 210N. Fine filter design is performed at filter design 212A through 212N, such as to generate beam forming filters, noise reduction filters or other suitable filters. The fine filters are converted from the frequency domain to the time domain at IFFT 214A through 214N. The filters are then applied to the buffered inputs at filter 216A through 216N, and the output signals are then combined.

Figure 3:
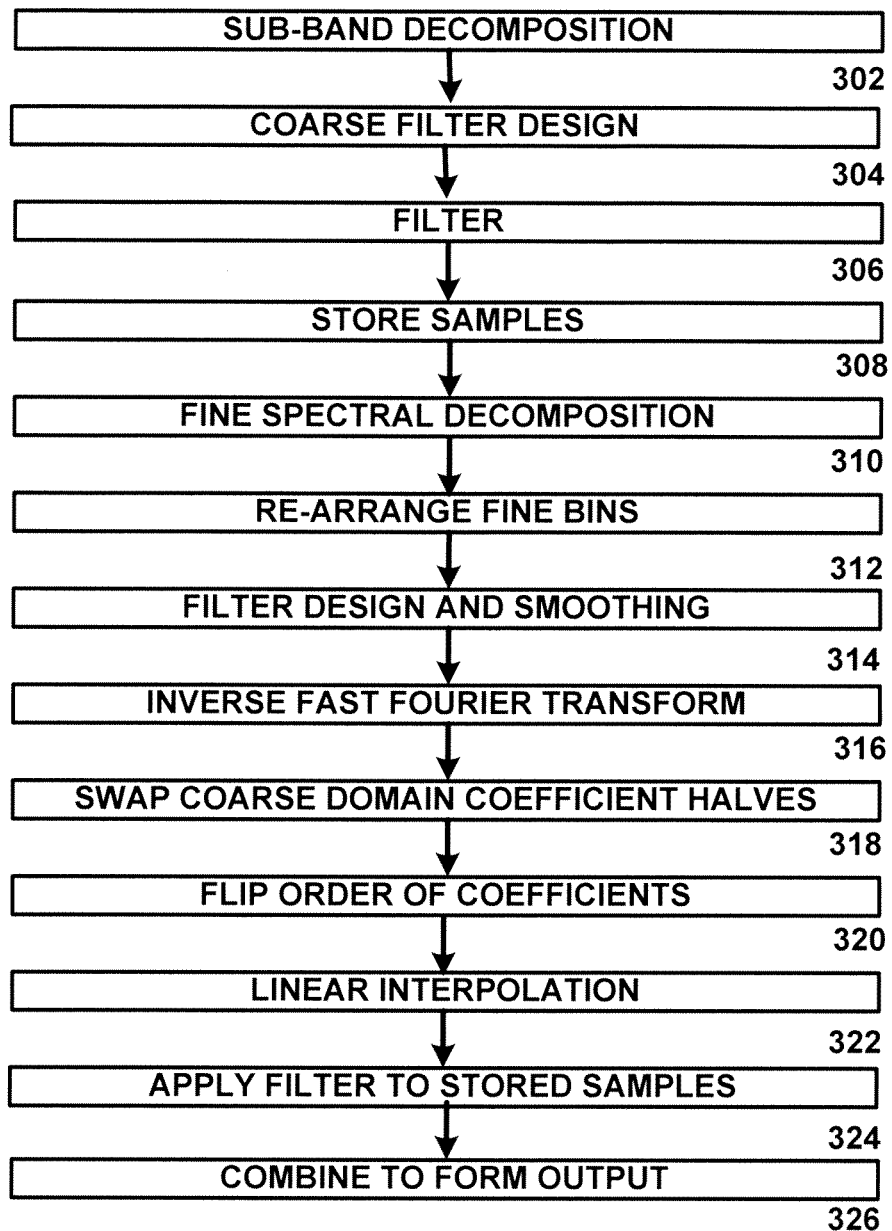
FIG. 3 is a diagram of an algorithm for sub-band processing in accordance with an exemplary embodiment of the present disclosure.

FIG. 3 is a diagram of an algorithm 300 for sub-band processing in accordance with an exemplary embodiment of the present disclosure. Algorithm 300 can be implemented in hardware or a suitable combination of hardware and software, and can be one or more software systems operating on a processor.

Algorithm 300 begins at 302, where a signal is received and coarse spectral decomposition of the signal is performed, such as by using a uniform DET filter bank or in other suitable manners. The algorithm then proceeds to 304 where coarse filter design is performed, and the filters are applied at 306. The algorithm then proceeds to 308 where the coarse filtered input signal is buffered. The algorithm then proceeds to 310.

At 310, fine spectral decomposition is performed, such as by using a windowed fast Fourier transform or in other suitable manners, and the algorithm proceeds to 312, where the bins are rearranged. The algorithm then proceeds to 314 where fine filter design and smoothing is performed, such as beam forming filters, noise reduction filters or other suitable filters. The filters are converted from the frequency domain to the time domain at 316, such as by inverse fast Fourier transform or in other manners. The algorithm then proceeds to 318 where the coarse domain coefficient halves are swapped, and the order of coefficients is flipped at 320. Linear interpolation is then performed at 322 and the filter is applied to the buffered samples of the input signal at 324, which are then combined to generate the output signal at 326.

It should be emphasized that the above-described embodiments are merely examples of possible implementations. Many variations and modifications may be made to the above-described embodiments without departing from the principles of the present disclosure. All such modifications and variations are intended to be included herein within the scope of this disclosure and protected by the following claims.

What is claimed is:

1. A method for signal processing, comprising:
    receiving a time domain signal having a sample-rate Fs;
    generating N sub-band signal bands of the time domain signal using a spectral decomposition process to transform the time domain signal to a frequency domain;
    representing a first sub-band of the N sub-band signal bands as a time domain signal and transforming the first sub-band of the N sub-band signal bands to the frequency domain at a first resolution and, representing a second sub-band signal band of the N sub-band signal bands as a time domain signal and transforming the second sub-band of the N sub-band signal bands to the frequency domain at a second resolution, where the first resolution is different from the second resolution;
    determining one or more first filter coefficients using frequency domain components from the first sub-band and one or more second filter coefficients using frequency domain components from the second sub-band;
    transforming the one or more first filter coefficients from the frequency domain to the time domain;
    transforming the one or more second filter coefficients from the frequency domain to the time domain;
    applying the first time domain filter coefficients to the first sub-band of the N sub-band signal bands; and
    applying the second time domain filter coefficients to the second sub-band of the N sub-band signal bands.

2. The method of claim 1 wherein determining the one or more first filter coefficients using the frequency domain components from the first signal band comprises determining one or more finite impulse response filter coefficients.

3. The method of claim 1 wherein determining the one or more second filter coefficients using the frequency domain components from the second signal band comprises determining one or more finite impulse response filter coefficients.

4. The method of claim 1 wherein the first resolution is lower than the second resolution if the first time domain signal sub-band is a higher frequency that the second time domain signal sub-band.

5. The method of claim 1 further comprising performing filtering on the first sub-band of the N sub-band signal bands in the time domain prior to transforming the first sub-band to the frequency domain.

6. The method of claim 1 further comprising performing acoustic echo cancellation processing on the first time domain signal sub-band prior to transforming the first time domain signal sub-band to the frequency domain.

7. The method of claim 1 further comprising performing finite impulse response (FIR) filtering with least mean squares (LMS) adaptation processing on the first time domain signal sub-band prior to transforming the first time domain signal sub-band to the frequency domain.

8. The method of claim 1 further comprising smoothing the one or more first filter coefficients and the one or more second filter coefficients.

9. The method of claim 1 further comprising changing an order of the first time domain filter coefficients.

10. A system for signal processing comprising:
    a sub-band analysis system configured to receive a time domain input signal and to generate a plurality of coarse filtered sub-band output signals in the frequency domain;
    a plurality of fine spectral decomposition systems, each configured to receive one of the coarse filtered sub-band outputs and to generate a plurality of frequency domain sub-band output signals;
    a plurality of filter design systems, each configured to receive one of the plurality of frequency domain sub-band signals outputs and to generate a frequency domain sub-band filter; and
    a plurality of frequency to time domain converters, each configured to receive one of the frequency domain sub-band filters and to generate a time domain sub-band filter.

11. The system of claim 10 wherein the sub-band analysis system comprises a uniform discrete Fourier transform filter bank.

12. The system of claim 10 wherein the sub-band analysis system comprises a plurality of coarse filters each comprising an echo cancellation system.

13. The system of claim 10 wherein each of the plurality of fine spectral decomposition systems comprises a windowed fast Fourier transform system.

14. The system of claim 10 wherein each of the plurality of filter design systems comprises a beam forming system.

15. The system of claim 10 further comprising a plurality of buffers, each configured to receive one of the coarse filtered sub-band outputs and to store the coarse filtered sub-band output.

16. The system of claim 15 wherein each of the time domain sub-band filters is applied to one of the stored coarse filtered sub-band outputs to generate an output.

17. The system of claim 15 wherein the outputs are combined.

18. A system for signal processing comprising:
    a sub-band analysis system configured to receive an input signal and to generate a plurality of coarse filtered sub-band output signals in the frequency domain;
    a plurality of buffers, each configured to receive one of the coarse filtered sub-band output signals and to store the coarse filtered sub-band output;
    a plurality of fine spectral decomposition systems, each configured to receive one of the coarse filtered sub-band outputs as a time domain signal and to generate a frequency domain sub-band output;
    a plurality of filter design systems, each configured to receive one of the frequency domain sub-band outputs and to generate a frequency domain sub-band filter; and
    a plurality of frequency to time domain converters, each configured to receive one of the frequency domain sub-band filters and to generate a time domain sub-band filter;
    wherein the sub-band analysis system comprises a uniform discrete Fourier transform filter bank;
    wherein the plurality of coarse filters each comprise an echo cancellation system;

wherein each of the plurality of fine spectral decomposition systems comprises a windowed fast Fourier transform system;
wherein each of the plurality of filter design systems comprises a beam forming system; and
wherein each of the time domain sub-band filters is applied to one of the stored coarse filtered sub-band outputs to generate an output, and the outputs are combined.

* * * * *